(12) United States Patent
Hong et al.

(10) Patent No.: US 12,086,408 B2
(45) Date of Patent: Sep. 10, 2024

(54) MEMORY CONTROLLERS, STORAGE DEVICES, AND CONTROLLING METHODS OF STORAGE DEVICES

(71) Applicant: Samsung Electronics Co., Ltd., Suwon-si (KR)

(72) Inventors: Jinwoo Hong, Suwon-si (KR); Heewoong Kang, Suwon-si (KR); Yunjung Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 57 days.

(21) Appl. No.: 17/979,801

(22) Filed: Nov. 3, 2022

(65) Prior Publication Data

US 2023/0148409 A1   May 11, 2023

(30) Foreign Application Priority Data

Nov. 10, 2021   (KR) .......................... 10-2021-0154277
Dec. 22, 2021   (KR) .......................... 10-2021-0185408

(51) Int. Cl.
    *G06F 3/06*       (2006.01)
(52) U.S. Cl.
    CPC .......... *G06F 3/0604* (2013.01); *G06F 3/0619* (2013.01); *G06F 3/064* (2013.01); *G06F 3/0653* (2013.01); *G06F 3/0679* (2013.01)
(58) Field of Classification Search
    CPC ...... G06F 3/0604; G06F 3/0619; G06F 3/064; G06F 3/0653; G06F 3/0679; G06F 12/0246; G06F 2212/7208; G11C 8/04; G11C 8/08; G11C 16/06; G11C 16/08; G11C 16/26; G11C 16/3418; G11C 16/3427

See application file for complete search history.

(56) References Cited

U.S. PATENT DOCUMENTS

| | | | |
|---|---|---|---|
| 9,240,245 B1 | 1/2016 | Bellorado et al. | |
| 9,406,390 B2 | 8/2016 | Kim et al. | |
| 9,431,122 B2 | 8/2016 | Lee | |
| 9,613,687 B2 | 4/2017 | Kim et al. | |
| 9,921,908 B2 | 3/2018 | Yum et al. | |
| 10,049,755 B2 | 8/2018 | Lee et al. | |
| 10,310,924 B2 | 6/2019 | Jei et al. | |
| 2016/0118132 A1* | 4/2016 | Prins | G06F 11/076 |
| | | | 714/704 |

(Continued)

FOREIGN PATENT DOCUMENTS

KR   102277521 B1   7/2021

*Primary Examiner* — Larry T MacKall
(74) *Attorney, Agent, or Firm* — Myers Bigel, P.A.

(57) ABSTRACT

A memory controller may include: a weight management unit configured to store a weight based on a read disturb strength of each of the plurality of word lines of the plurality of memory blocks; a counter configured to increase a read count of a management group that includes a target word line, based on the weight of the target word line obtained from the weight management unit, the counter configured to increase the read count in response to the controller receiving a read request for the target word line from an external host device; and a verification operation determination unit configured to determine whether to perform or to not perform a word line verification operation based on a comparison of a reference interval count with the read count of the management group that includes the target word line.

19 Claims, 9 Drawing Sheets

(56) References Cited

U.S. PATENT DOCUMENTS

2018/0374549 A1* 12/2018 Padilla ............... G11C 16/3422
2020/0159602 A1*  5/2020 Oh ..................... G11C 11/1659
2020/0310896 A1  10/2020 Lee

* cited by examiner

FIG. 4

| WORD LINE | NUMBER OF READS UNTIL ERROR HAS OCCURRED | WEIGHT |
|---|---|---|
| FIRST WORD LINE | 120,000 | (1/120,000)*a |
| SECOND WORD LINE | 100,000 | (1/100,000)*a |
| THIRD WORD LINE | 100,000 | (1/100,000)*a |
| ⋮ | ⋮ | ⋮ |
| (N−1)-TH WORD LINE | 10,000 | (1/10,000)*a |
| N-TH WORD LINE | 100,000 | (1/100,000)*a |
| (N+1)-TH WORD LINE | 10,000 | (1/10,000)*a |
| ⋮ | ⋮ | ⋮ | ns
MEMORY CONTROLLERS, STORAGE DEVICES, AND CONTROLLING METHODS OF STORAGE DEVICES

CROSS-REFERENCE TO RELATED APPLICATIONS

This application is based on and claims priority under 35 U.S.C. § 119 to Korean Patent Application No. 10-2021-0154277, filed on Nov. 10, 2021, and Korean Patent Application No. 10-2021-0185408, filed on Dec. 22, 2021, in the Korean Intellectual Property Office, and the entire contents of each above-identified application are incorporated by reference herein.

TECHNICAL FIELD

The present disclosure relates to memory controllers and, more particularly, to memory controllers capable of (or having a capability of) determining whether or not a verification operation for a word line included in a non-volatile memory device is performed, based on a weight of a target word line. The present disclosure also relates to storage devices and methods of controlling storage devices.

BACKGROUND

Memory devices may be classified into volatile memory devices and non-volatile memory devices, depending on whether stored data is lost when a supply of power thereto is stopped or interrupted. Non-volatile memory devices include flash memory devices that may be electrically erased and programmed.

When a read operation for data stored in a non-volatile memory device is performed, a read disturb occurs in the stored data. The read disturb causes deterioration in a word line in a memory block of the non-volatile memory device. The deterioration of the word line may damage the stored data and ultimately inhibit the reliability of a storage device. Therefore, a method of verifying the reliability of a word line in a memory block of a non-volatile memory device is desirable.

SUMMARY

The inventive concepts of the present disclosure provide a memory controller capable of determining whether a word line verification operation is performed, based on a weight of a target word line.

According to some aspects of the inventive concepts, there is provided a memory controller configured to control a non-volatile memory device that includes a plurality of memory blocks, each memory block including a plurality of memory cells connected to a plurality of word lines. The memory controller may include: a weight management unit configured to store a weight based on a read disturb strength of each of the plurality of word lines of the plurality of memory blocks; a counter configured to increase a read count of a management group that includes a target word line, based on the weight of the target word line obtained from the weight management unit, the counter configured to increase the read count in response to the controller receiving a read request for the target word line from an external host device; and a verification operation determination unit configured to determine whether to perform or to not perform a word line verification operation based on a comparison of a reference interval count with the read count of the management group that includes the target word line.

According to some aspects of the inventive concepts, there is provided a method of controlling a storage device. The storage device may include a non-volatile memory device that includes a plurality of memory blocks, each memory block including a plurality of memory cells connected to a plurality of word lines. The method may include: receiving a read request for a target word line from a host device; obtaining a weight of the target word line; increasing a read count of a management group that includes the target word line, based on a weight of the target word line; and determining whether to perform or to not perform a word line verification operation, based on a comparison of a reference interval count with the read count of the management group that includes the target word line.

According to some aspects of the inventive concepts, there is provided a storage device including: a non-volatile memory device including a plurality of non-volatile memory chips; and a memory controller connected to the plurality of non-volatile memory chips through a plurality of channels, wherein each of the non-volatile memory chips includes a plurality of memory blocks, each memory block including a plurality of memory cells connected to a plurality of word lines. The memory controller may include: a weight management unit configured to store a weight based on a read disturb strength of each of the plurality of word lines of the plurality of memory blocks; a counter configured to increase a read count of a management group that includes a target word line, based on the weight of the target word line obtained from the weight management unit, the counter configured to increase the read count in response to the controller receiving a read request for the target word line from an external host device; and a verification operation determination unit configured to determine whether to perform or to not perform a word line verification operation based on a comparison of a reference interval count with the read count of the management group that includes the target word line.

BRIEF DESCRIPTION OF THE DRAWINGS

Some examples of embodiments of the inventive concept will be more clearly understood from the following detailed description taken in conjunction with the accompanying drawings in which:

FIG. 4 is a diagram illustrating a method of setting a weight used in a memory controller according to some embodiments;

DETAILED DESCRIPTION

Hereinafter, some examples of embodiments of the inventive concepts will be described in detail by referring to the attached drawings.

Figure 1:
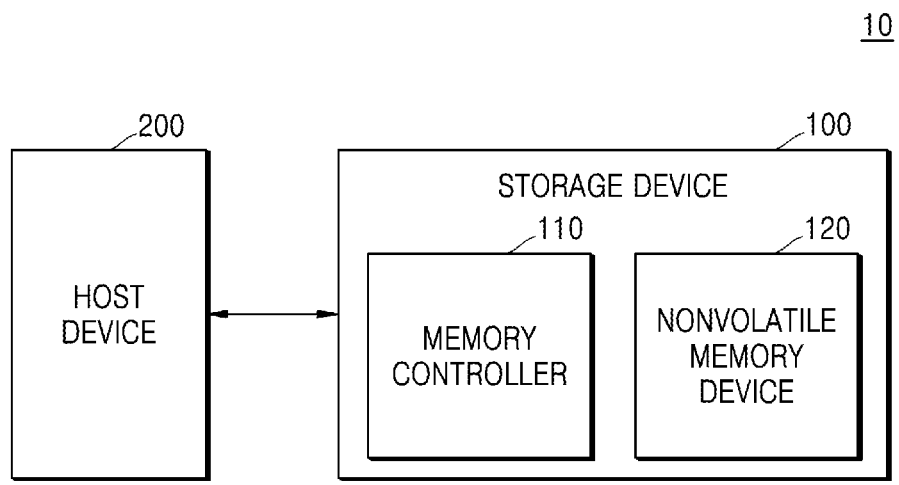
FIG. 1 is a block diagram illustrating a system according to some embodiments.

FIG. 1 is a block diagram illustrating a system according to some embodiments.

Referring to FIG. 1, a system 10 according to some embodiments of the inventive concepts may include a storage device 100 and a host device 200.

The host device 200 may transmit a read request, a write request, an erase request, and the like to the storage device 100. In some embodiments of the inventive concept, the host device 200 may be any one of a number of different electronic devices, such as a computer, a smart phone, a smart pad, or the like.

The storage device 100 may include a memory controller 110 and a non-volatile memory device 120.

The non-volatile memory device 120 may include a plurality of memory blocks. In addition, each of the plurality of memory blocks may include a plurality of memory cells connected to a plurality of word lines. An example of an embodiment of the memory block may be described in greater detail with reference to FIG. 2.

Figure 2:
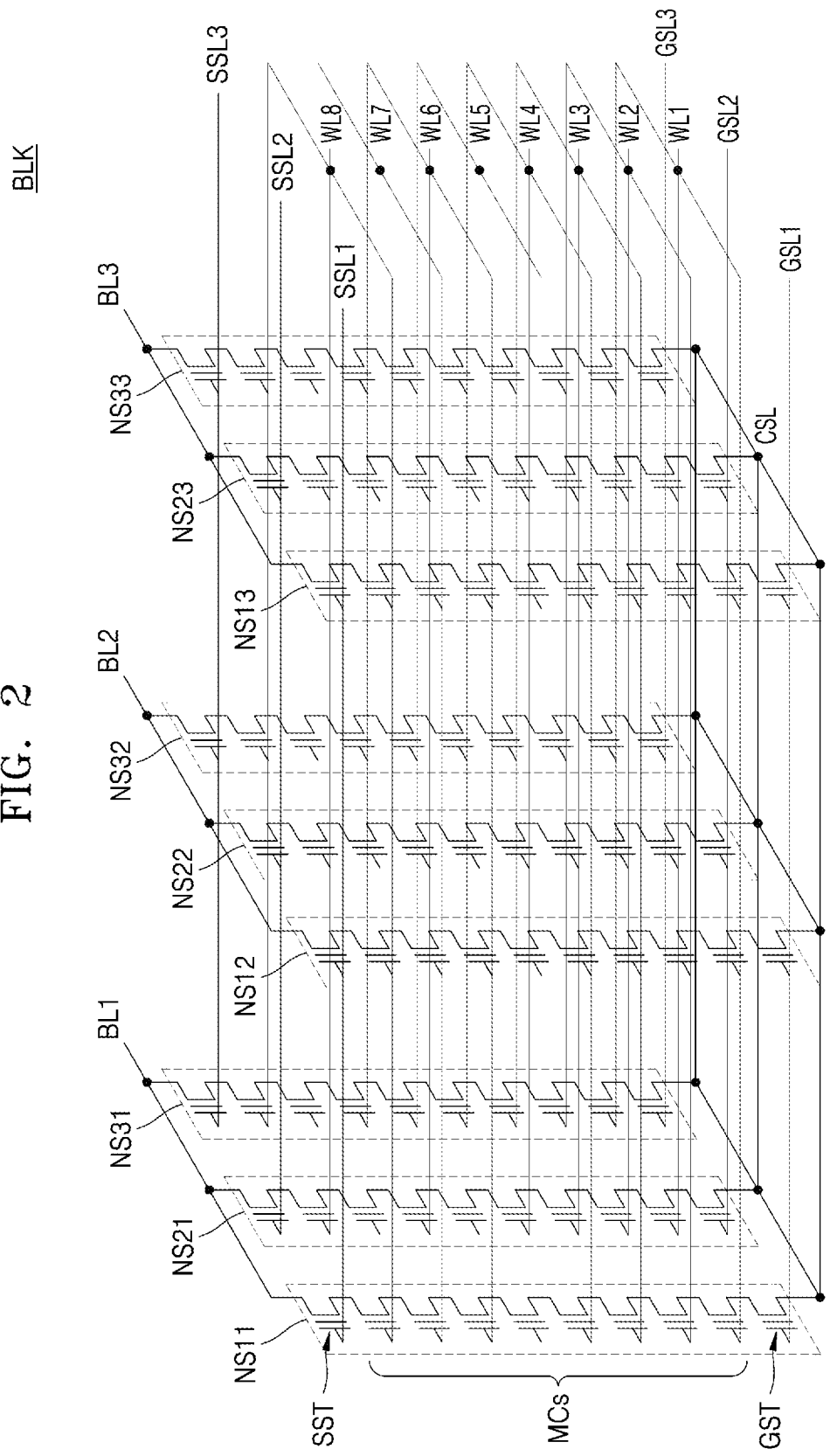
FIG. 2 is a circuit diagram illustrating a memory block according to some embodiments.

FIG. 2 is a circuit diagram illustrating a memory block according to some embodiments.

Referring to FIG. 2, the memory block BLK may include a plurality of memory cell strings NS11 to NS33, a plurality of word lines WL1 to WL8, a plurality of bit lines BL1 to BL3, a plurality of ground select lines GSL1 to GSL3, a plurality of string select lines SSL1 to SSL3, and a common source line CSL. Here, the number of the plurality of memory cell strings NS11 to NS33, the number of the plurality of word lines WL1 to WL8, the number of the plurality of bit lines BL1 to BL3, the number of the plurality of ground select lines GSL1 to GSL3, and the number of the plurality of string select lines SSL1 to SSL3 may be variously changed according to different embodiments of the present inventive concepts, and are therefore not limited to the numbers shown in FIG. 2.

The plurality of memory cell strings NS11, NS21, and NS31 may be provided between the first bit line BL1 and the common source line CSL, and the plurality of memory cell strings NS12, NS22, and NS32 may be provided between the second bit line BL2 and the common source line CSL, and the plurality of memory cell strings N13, NS23, and NS33 may be provided between the third bit line BL3 and the common source line CSL. Each memory cell string, e.g., NS11 may include a string select transistor SST, a plurality of memory cells MCs, and a ground select transistor GST that are connected in series.

The string select transistor SST of each memory cell string may be connected to corresponding string select lines SSL1 to SSL3. For example, the string select transistors of the plurality of memory cell strings NS11, NS12, and NS13 may be connected to the first string select line SSL1. The plurality of memory cells MCs of each memory cell string may be connected to corresponding word lines WL1 to WL8, respectively. The ground select transistor GST of each memory cell string may be connected to corresponding ground select lines GSL1 to GSL3. The string select transistor SST of each memory cell string may be connected to the corresponding bit lines BL1 to BL3, and the ground select transistor GST of each memory cell string may be connected to the common source line CSL.

Referring back to FIG. 1, the non-volatile memory device 120 may store data through the plurality of memory cells. Data stored in the non-volatile memory device 120 may be managed by the memory controller 110.

The memory controller 110 may access the non-volatile memory device 120 based on a request received from the host device 200. When receiving a read request from the host device 200, the memory controller 110 may perform a read operation of fetching data stored in the non-volatile memory device 120. When receiving a write request from the host device 200, the memory controller 110 may perform a write operation of storing data in the non-volatile memory device 120. When receiving an erase request from the host device 200, the memory controller 110 may perform an erase operation of deleting data stored in the non-volatile memory device 120.

Even at times when a request is not received from the host device 200, the memory controller 110 may perform various operations for controlling the non-volatile memory device 120. For example, the memory controller 110 may perform a word line verification operation to determine whether a deterioration has occurred in a word line included in the non-volatile memory device 120.

The word line verification operation may be an operation of determining whether a deterioration has occurred in a word line to be verified, which is selected from the plurality of word lines included in the non-volatile memory device 120. In some embodiments of the inventive concepts, the memory controller 110 may perform a read operation on data stored in a word line to be verified, which is selected from the plurality of word lines included in the non-volatile memory device 120, and determine whether an error has occurred in the word line to be verified.

In some embodiments of the inventive concepts, the memory controller 110 may receive a read request for a word line to be read, e.g., a target word line of the read request. In response to receiving a read request for the target word line, the memory controller 110 may increase a read count of a management group that includes the target word line, based on a weight of the target word line. In addition, the memory controller 110 may determine whether to perform or to not perform the word line verification operation, based on the read count of the management group that includes the target word line that is to be read. A more detailed structure and operation of the memory controller 110 will be described later with reference to FIGS. 3 to 8.

The memory controller 110 according to some embodiments of the inventive concepts may determine whether to perform or to not perform a word line verification operation, based on the weight of the target word line. Accordingly, the read performance of the non-volatile memory device 120 may be improved by calculating more accurately a time point of performing the word line verification operation.

Figure 3:
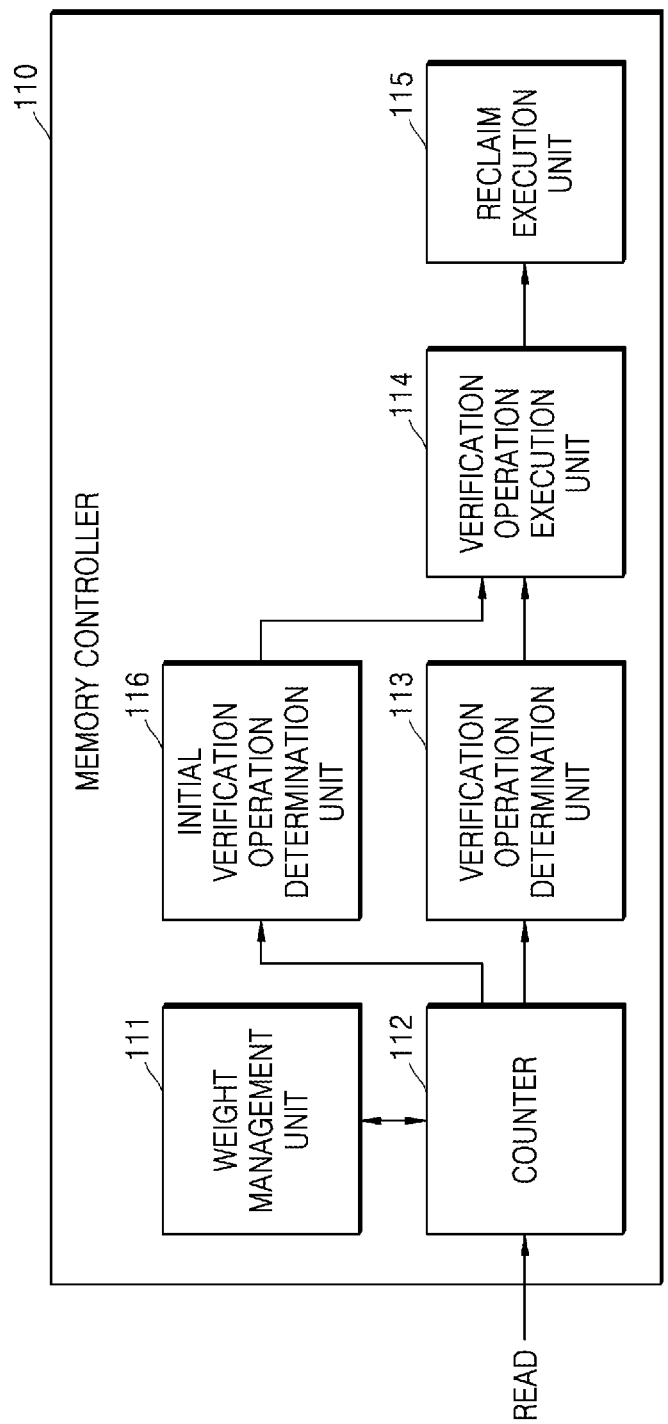
FIG. 3 is a block diagram illustrating a detailed structure of a memory controller according to some embodiments.

FIG. 3 is a block diagram illustrating a detailed structure of a memory controller according to some embodiments.

Referring to FIG. 3, the memory controller 110 according to some embodiments of the inventive concepts may include a weight management unit 111, a counter 112, and a verification operation determination unit 113. In addition, the memory controller 110 according to some embodiments of the inventive concepts may further include at least one of a verification operation execution unit 114, a reclaim execution unit 115, and an initial verification operation determination unit 116.

The weight management unit 111 may store a weight based on a read disturb strength of each of the plurality of word lines of the plurality of memory blocks.

The weight may be a value indicating the degree to which the word line is deteriorated by the read disturb. The weight may be inversely proportional to the read disturb strength indicating how strong the word line is to the read disturb. For example, if the read disturb strength of the word line is relatively high, the weight may be relatively low. Alternatively, if the read disturb strength of the word line is relatively low, the weight may be relatively high.

The weight management unit 111 may manage a weight corresponding to each of the plurality of word lines of the plurality of memory blocks. In addition, when the weight management unit 111 receives a read request from the host device 200, the weight of the target word line may be transmitted to the counter 112.

In some embodiments of the inventive concepts, the weight may be set to be inversely proportional to the number of reads until an error occurs in the word line. This is described in greater detail with reference to FIG. 4.

FIG. 4 is a diagram illustrating a method of setting a weight used in a memory controller according to some embodiments.

Referring to FIG. 4, a table showing the number of times of performing a read operation and a weight until an error occurs in each word line of an arbitrary memory block may be checked.

For example, in the case of a first word line, the number of reads until an error occurs in the first word line may be 120,000 times. In this case, the weight of the first word line may be set to a value obtained by multiplying a reciprocal of 120,000 times by a preset constant "a".

As another example, in the case of a second word line, the number of reads until an error occurs in the second word line may be 100,000 times. In this case, the weight of the second word line may be set to a value obtained by multiplying a reciprocal of 100,000 times by the preset constant "a".

Likewise, the weight of the (N−1)-th word line may be set to a value obtained by multiplying a reciprocal of 10,000 times by a preset constant "a", the weight of the N-th word line may be set to a value obtained by multiplying a reciprocal of 100,000 times by a preset constant "a", and the weight of the (N+1)-th word line may be set to a value obtained by multiplying a reciprocal of 10,000 times by a preset constant "a". The number of times until an error occurs in the (N−1)-th and the (N+1)-th word lines may each be 10,000 times, and the number of times until an error occurs in the N-th word line may be 100,000 times. The present disclosure is not limited to the numbers of times until errors occur shown in the table of FIG. 4.

As described above, as the weight for each word line may be set by reflecting the number of reads until an error occurs in the word line, the weight may reflect the degree of deterioration of the word line due to the read disturb.

Referring back to FIG. 3, the weight management unit 111 may classify at least one word line having a same weight from among the plurality of word lines of the plurality of memory blocks into a same weight group. That is, the weight management unit 111 does not individually manage a weight of each of the plurality of word lines of the plurality of memory blocks, but may classify at least one word line having the same weight into the same weight group, and manage weights for each weight group.

For example, in the case of the embodiment shown in FIG. 4, the weight management unit 111 may classify and manage the second word line, the third word line, and the N-th word line into a same weight group, and may classify and manage the (N−1)-th word line and the (N+1)-th word line as another same weight group.

In addition, when receiving the read request, the weight management unit 111 may transfer, to the counter 112, the weight corresponding to the weight group including the target word line. For example, in the case of example illustrated in FIG. 4, when receiving a read request for the third word line, the weight management unit 111 may determine which weight group including the third word line is, and transfer to the counter 112 the weight corresponding to the weight group that includes the third word line.

When the counter 112 receives a read request for the target word line from the external host device 200, the read count of the management group including the target word line may be increased based on the weight of the target word line, which as discussed above may be stored in the weight management unit 111.

The counter 112 may receive the weight of the word line from the weight management unit 111. In some embodiments, when the counter 112 receives a read request from the host device 200, the counter 112 may receive a weight of the target word line from the weight management unit 111.

The counter 112 may increase the read count of the management group including the target word line (e.g., the target word line of the read request), based on the received weight of the target word line. That is, the counter 112 may increase the read count of the management group that includes the target word line by or based on the obtained weight of the target word line.

Here, the management group may refer to a group in which the counter 112 manages the same read count, and the management group may include the word lines (e.g., all of the word lines) of a memory block or of a super block (at least two memory blocks). In addition, the read count may be an index indicating the degree to which a read operation has been performed for the corresponding management group.

In some embodiments of the inventive concept, the nonvolatile memory device 120 may include first to M-th memory blocks, and the management group may include memory block-sized units. In this case, the management group may include first to M-th management groups that correspond to the first to M-th memory blocks. In this case, when a read request for a word line included in the M-th memory block is received from the host device 200, the counter 112 may receive a weight of the target word line from the weight manager 111, and may increase the read count of the M-th management group by or based on the received weight of the target word line.

The verification operation determination unit 113 may determine whether to perform or to not perform a word line verification operation by comparing a reference interval count with the read count of the management group that includes the target word line.

The reference interval count may be a count that serves as a reference or threshold for determining whether to perform or to not perform a word line verification operation. In some embodiments, the reference interval count may be set to one of any values having a preset distribution. For example, the reference interval count may be set to any one of values having a Gaussian distribution having a preset average value.

The word line verification operation may be an operation of determining whether a deterioration has occurred in a word line to be verified, which is selected from the plurality of word lines included in the non-volatile memory device 120.

In some embodiments of the inventive concepts, when the read count of the management group including the target word line is equal to or greater than the reference interval count, it may be determined to perform a word line verification operation on the management group including the target word line. Conversely, when the read count of the management group including the target word line is less than the reference interval count, the verification operation determination unit 113 may determine to not perform the word line verification operation.

When it is determined by the verification operation determination unit 113 to perform the word line verification operation, the verification operation execution unit 114 may perform the word line verification operation. The verification operation execution unit 114 may perform a word line verification operation by determining whether an error such as an uncorrectable error correction codes (UECC) has occurred on the word line to be verified.

In greater detail, when it is determined by the verification operation determination unit 113 to perform the word line verification operation, the verification operation execution unit 114 may perform a read operation on the word line to be verified.

Verifying a word line may include verifying whether an error has occurred from among the plurality of word lines included in the management group for which the word line verification operation is to be performed. The word line to be verified may be set to include at least one word line from among the plurality of word lines included in the management group for which the word line verification operation is to be performed. In some embodiments of the inventive concepts, the word line to be verified may be set to include at least one of word lines adjacent to the target word line which are most recently received and/or word lines relatively weak to the read disturb.

The verification operation execution unit 114 may determine whether an error has occurred in the word line to be verified based on the result of performing the read operation on the word line to be verified. In some embodiments of the inventive concepts, the verification operation execution unit 114 may determine whether an error has occurred in the word line to be verified by determining whether the UECC has occurred in data obtained by performing the read operation on the word line to be verified.

When the word line verification operation is completed, the verification operation execution unit 114 may initialize a read count of the management group including the target word line. Accordingly, repetitive execution of the word line verification operation for the same management group may be prevented.

When it is determined that an error has occurred in the word line to be verified, the reclaim execution unit 115 may perform a reclaim operation on the word line to be verified. The reclaim operation may be an operation of transferring data stored in the deteriorated word line to a non-deteriorated word line and storing the same. In some embodiments of the inventive concepts, the reclaim operation may be performed only on the deteriorated word line. In some embodiments of the inventive concept, the reclaim operation may be performed on an entire memory block that includes the deteriorated word line.

The initial verification operation determination unit 116 may determine whether to perform or to not perform a word line verification operation by comparing the read count of the management group including the target word line with a reference trigger count. In contrast to the verification operation determination unit 113, the initial verification operation determination unit 116 may determine whether to perform or to not perform the word line verification operation based on a reference trigger count, rather than the reference interval count.

The reference trigger count may be a count that serves as a reference for determining whether to perform or to not perform a first or initially executed word line verification operation. In some embodiments, the reference trigger count may have a value greater than the reference interval count. As the reference trigger count may be set to be larger than the reference interval count, the first executed word line verification operation may be performed after a large number of read operations are performed, and second or subsequent executed word line verification operations may be performed after a smaller number of read operations are performed.

The reference trigger count may be set to one of any values having a preset distribution. For example, the reference trigger count may be set to any one of values having a Gaussian distribution having a preset average value.

In some embodiments of the inventive concepts, when the read count of the management group that includes the target word line is equal to or greater than the reference trigger count, the initial verification operation determination unit 116 may determine to perform the word line verification operation on the management group including the target word line. Conversely, when the read count of the management group including the target word line is less than the reference trigger count, the initial verification operation determination unit 116 may determine to not perform the word line verification operation.

In some embodiments, after it is determined by the initial verification operation determination unit 116 to perform the word line verification operation, the verification operation determination unit 113 may compare a reference interval count with a read count of the management group that includes the target word line, and determine whether to perform or to not perform the word line verification operation. That is, the verification operation determination unit 113 may start to operate after the first or initial executed word line verification operation is performed by the initial verification operation determination unit 116, and may determine whether to perform or to not perform the second or subsequent executed word line verification operations. In addition, after determining whether to perform or to not perform the firstly executed word line verification operation, the initial verification operation determination unit 116 may terminate operation.

When the memory controller 110 according to the inventive concepts as described above is used, a read count is increased based on a weight of a target word line, and it is determined whether to perform or to not perform a word line verification operation based on the read count, so that a time point of performing the word line verification operation may be calculated more accurately. In addition, the read performance of the non-volatile memory device 120 may be improved by calculating more accurately a time point of performing the word line verification operation.

Figure 5:
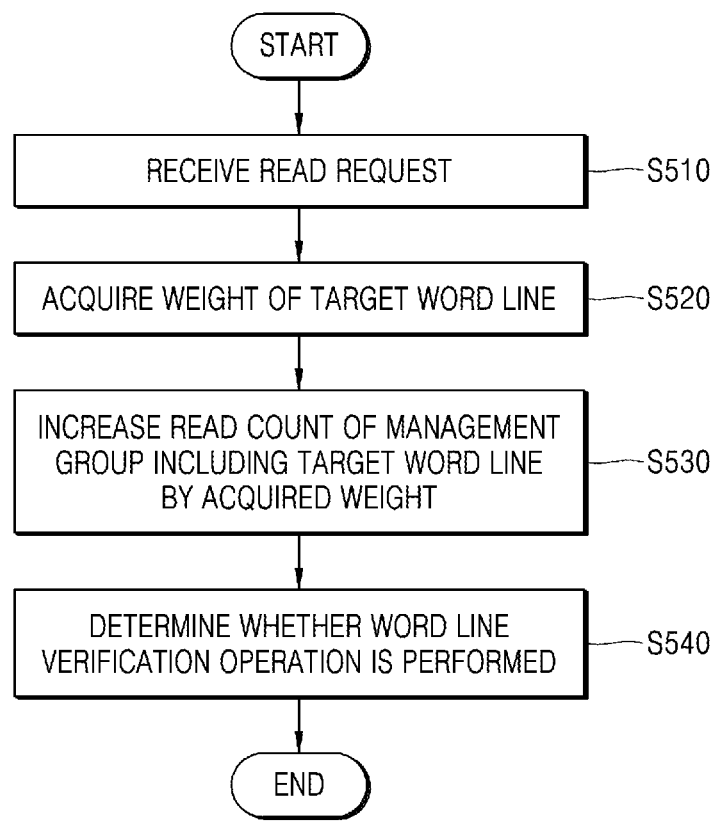
FIG. 5 is a flowchart illustrating an operation of a memory controller according to some embodiments.

FIG. 5 is a flowchart illustrating an operation of a memory controller according to some embodiments.

Referring to FIG. 5, in operation S510, the memory controller 110 may receive a read request from the host device 200. In some embodiments of the inventive concepts, the memory controller may receive a read request for an N-th word line of the M-th memory block.

In operation S520, the memory controller 110 may obtain a weight of a target word line. That is, the weight management unit 111 of the memory controller 110 may obtain a weight of the target word line based on the read request and transmit the obtained weight to the counter 112. In some embodiments of the inventive concepts, the weight management unit 111 may obtain a weight of an N-th word line of the M-th memory block and transmit the obtained weight to the counter 112.

In operation S530, the memory controller 110 may increase the read count of the management group that includes the target word line, based on the weight of the target word line. That is, the counter 112 of the memory controller 110 may increase, by or based on the obtained weight, the read count of the management group that includes the target word line. In some embodiments of the inventive concepts, the counter 112 may increase the read count of the M-th management group including the M-th memory block by the weight of the N-th word line of the M-th memory block.

In operation S540, the memory controller 110 may determine whether to perform or to not perform the word line verification operation. That is, the verification operation determination unit 113 of the memory controller 110 may determine whether to perform or not perform a word line verification operation by comparing a reference interval count with the read count of the management group that includes the target word line. In some embodiments of the inventive concepts, the verification operation determination unit 113 may compare the reference interval count with the read count of the M-th management group to determine whether to perform or to not perform the word line verification operation. The detailed operation of operation S540 may be described in more detail with reference to FIG. 6.

Figure 6:
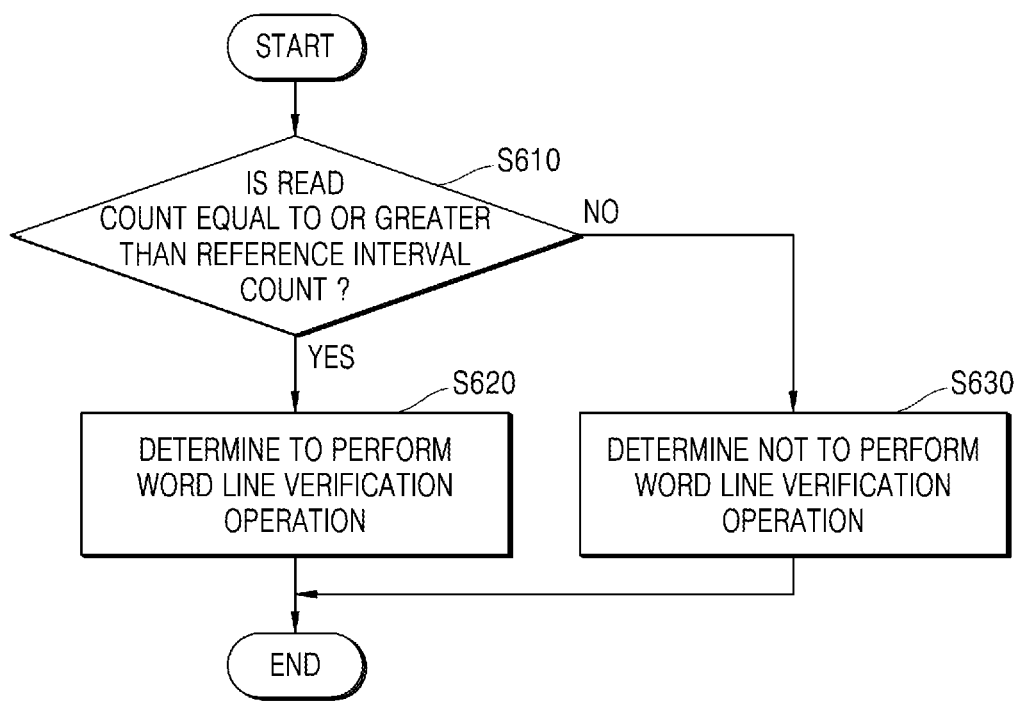
FIG. 6 is a flowchart illustrating a method of determining whether or not a memory controller performs a word line verification operation according to some embodiments.

FIG. 6 is a flowchart illustrating a method of determining whether a memory controller performs or does not perform a word line verification operation according to some embodiments.

Referring to FIG. 6, in operation S610, the memory controller 110 may determine whether a read count is equal to or greater than a reference interval count. In some embodiments of the inventive concepts, the verification operation determination unit 113 of the memory controller 110 may determine whether a read count of the M-th management group is equal to or greater than a reference interval count.

When the read count of the management group including the target word line is equal to or greater than the reference interval count (YES branch from operation S610), in operation S620, the memory controller 110 may determine to perform a word line verification operation on the management group including the target word line.

Conversely, when the read count of the management group including the target word line is less than the reference interval count (NO branch from operation S610), in operation S630, the memory controller 110 may determine to not perform the word line verification operation.

An operation after having determined to perform the word line verification operation may be described in more detail with reference to FIG. 7.

Figure 7:
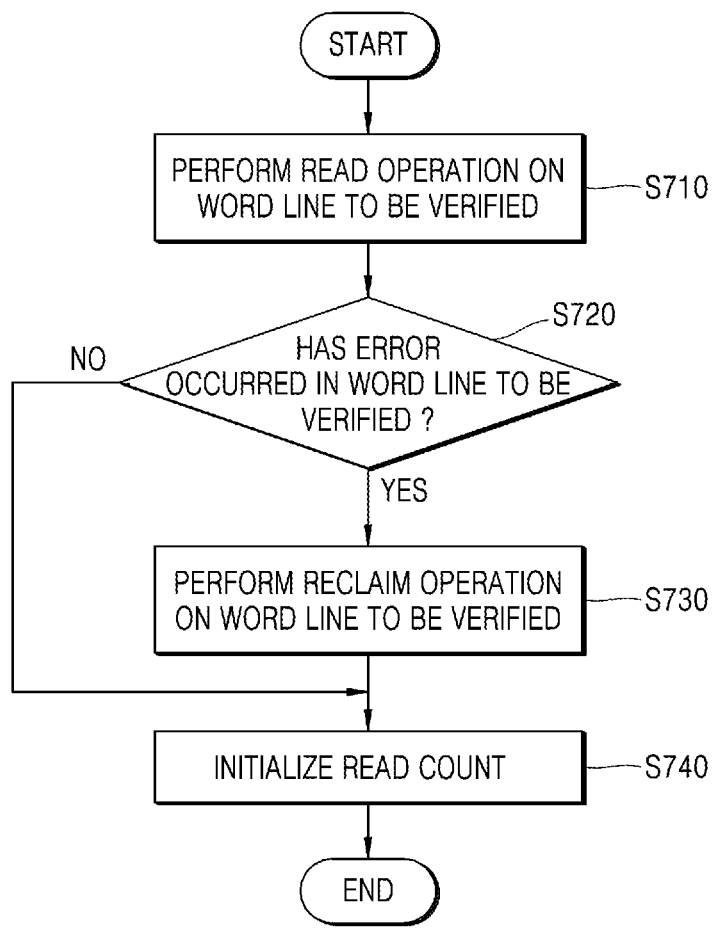
FIG. 7 is a flowchart illustrating an operation after a memory controller performs a word line verification operation according to some embodiments.

FIG. 7 is a flowchart illustrating an operation after a memory controller performs a word line verification operation according to some embodiments.

Referring to FIG. 7, in operation S710, the memory controller 110 may perform a read operation on a word line to be verified. In some embodiments of the inventive concepts, when the word line to be verified includes a word line adjacent to the target word line, the verification operation execution unit 114 of the memory controller 110 may perform a read operation on the (N−1)-th word line adjacent to the N-th word line which is the target word line.

In operation S720, the memory controller 110 may determine whether an error has occurred in the word line to be verified based on the result of performing the read operation on the word line to be verified. In some embodiments of the inventive concepts, the verification operation execution unit 114 of the memory controller 110 may determine whether an error has occurred in the word line to be verified by determining whether UECC has occurred in data read from the (N−1)-th word line.

When it is determined that an error has occurred in the word line to be verified (YES branch from operation S720), in operation S730, the memory controller 110 may perform a reclaim operation on the word line to be verified. In some embodiments of the inventive concepts, the reclaim execution unit 115 of the memory controller 110 may perform a reclaim operation on the (N−1)-th word line that is a word line to be verified.

Conversely, when it is determined that no error has occurred in the word line to be verified (NO branch from operation S720), the memory controller 110 may omit operation S730.

In operation S740, the memory controller 110 may initialize the read count of the management group including the target word line.

Figure 8:
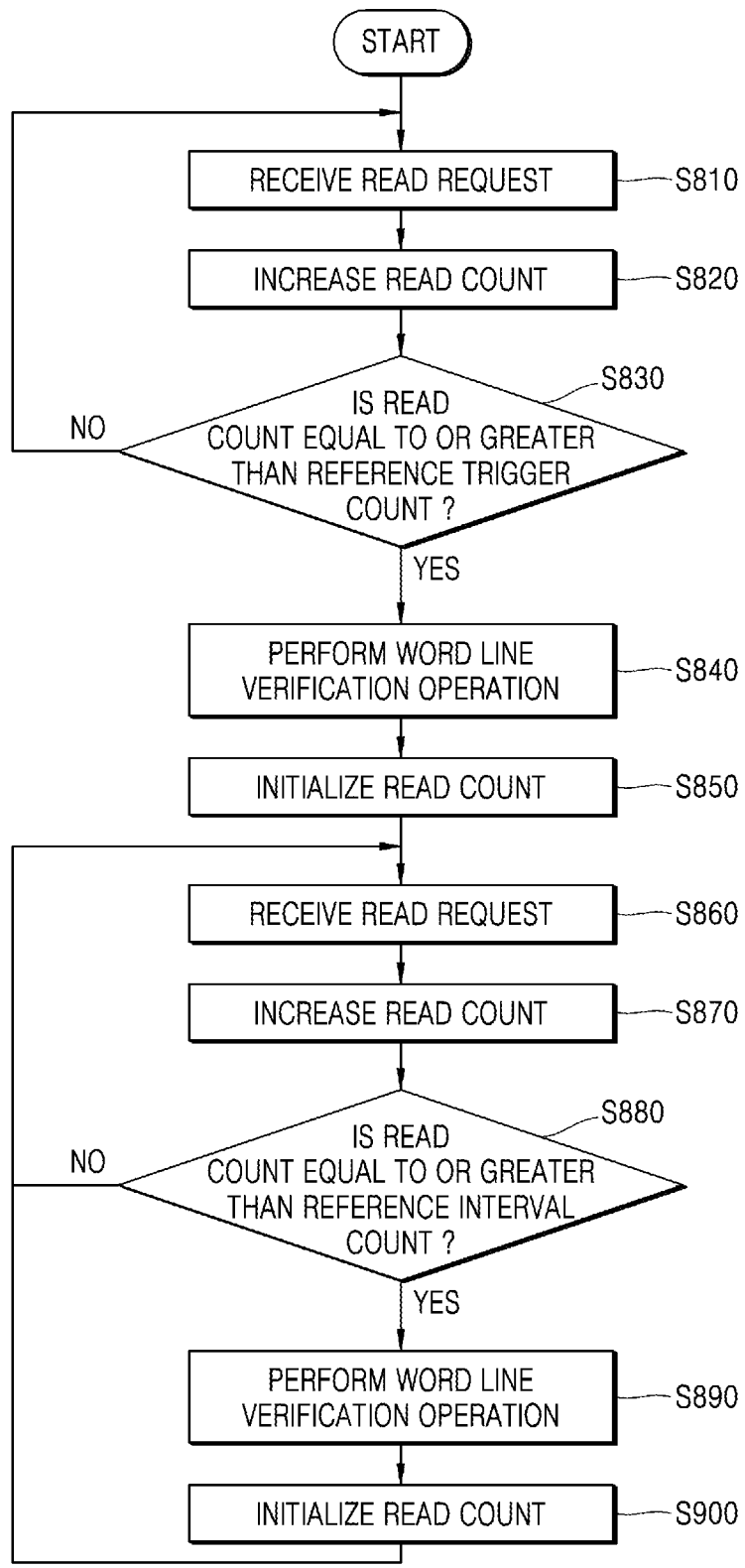
FIG. 8 is a flowchart illustrating an operation of a memory controller according to some embodiments.

FIG. 8 is a flowchart illustrating an operation of a memory controller according to some embodiments.

Referring to FIG. 8, in operation S810, the memory controller 110 may receive a read request from the host device 200. Then, in operation S820, the memory controller 110 may increase the read count of the management group including the target word line. Thereafter, in operation S830, the memory controller 110 may determine whether the read count is equal to or greater than the reference trigger count.

When the read count is not equal to or greater than the reference trigger count (NO branch from operation S830), the method may return to prior to operation S810. Conversely, when the read count is equal to or greater than the reference trigger count (YES branch from operation S830), in operation S840, a word line verification operation may be performed. Then, in operation S850, the memory controller 110 may initialize the read count.

In operation S860, the memory controller 110 may receive a read request from the host device 200. Then, in operation S870, the memory controller 110 may increase the read count of the management group including the target word line. Thereafter, in operation S880, the memory controller 110 may determine whether the read count is equal to or greater than the reference interval count.

When the read count is not equal to or greater than the reference interval count (NO branch from operation S880), the method may return to prior to operation S860. Conversely, when the read count is equal to or greater than the reference interval count (YES branch from operation S880), in operation S890, a word line verification operation may be performed. Then, in operation S900, the memory controller 110 may initialize the read count. After operation S900 is performed, operation S860 may be returned.

As described above, in some embodiments of the inventive concepts, performance of a first word line verification operation may be conditioned based on a reference trigger count, and after the first word line verification operation has been performed, performance of subsequent word line verification operations may be conditioned based on a reference interval count. The reference interval count may differ from the reference trigger count.

When using the storage device 100 and the control method of the storage device 100 according to the inventive concepts as described above, a read count may be increased based on a weight of a target word line, and whether to perform or to not perform a word line verification operation may be determined based on the read count, thereby more accurately calculating a time point of performing the word line verification operation. In addition, the read performance of the non-volatile memory device 120 may be improved by calculating more accurately a time point of performing the word line verification operation.

Figure 9:
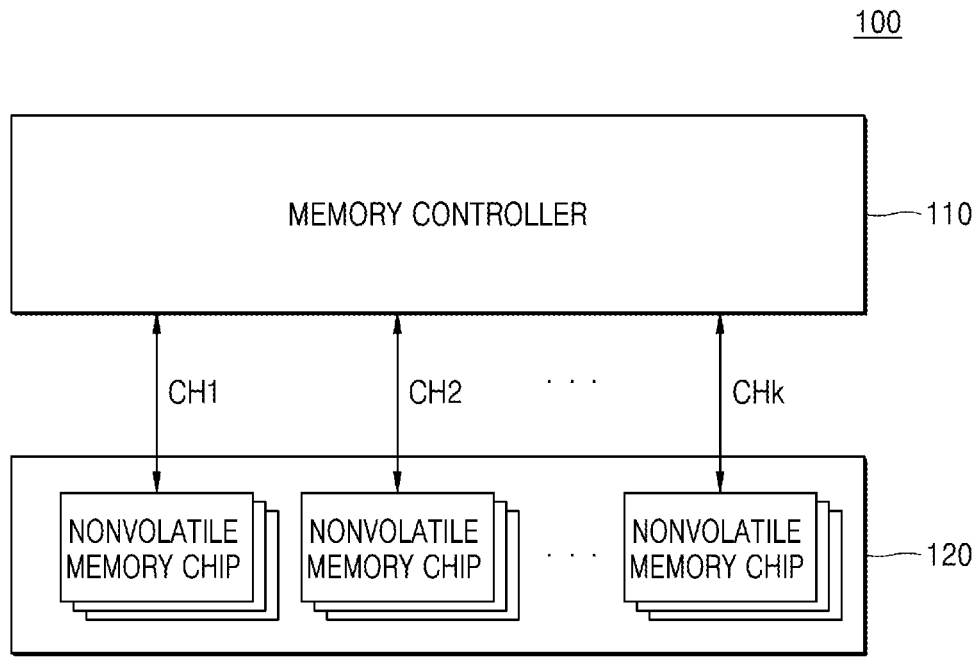
FIG. 9 is a diagram illustrating a storage device according to some embodiments.

FIG. 9 is a diagram illustrating a storage device according to some embodiments.

Referring to FIG. 9, the storage device 100 may include a memory controller 110 and a non-volatile memory device 120.

The non-volatile memory device 120 may include a plurality of non-volatile memory chips. The plurality of non-volatile memory chips may be connected to the memory controller 110 through a plurality of channels CH1 to CHk.

In some embodiments, the plurality of non-volatile memory chips may be divided into a plurality of groups. In addition, each group of the plurality of non-volatile memory chips may be connected to the memory controller 110 through one common channel.

In some embodiments, the management group managed by the counter 112 of the memory controller 110 may include variously-sized units, such as a group including a memory block, a super block, a non-volatile memory chip, or a plurality of non-volatile memory chips connected to the memory controller 110 through the same channel.

For example, when the memory controller 110 uses the non-volatile memory chip as units, the read count may be managed in a manner in which one read count corresponds to each of the plurality of non-volatile memory chips.

As another example, when the memory controller 110 uses as units a group including the plurality of non-volatile memory chips connected to the memory controller 110 through the same channel, the read count may be managed in a manner in which one read count corresponds to the non-volatile memory chips connected to the memory controller 110 via the first channel CH1, and one read count corresponds to the non-volatile memory chips connected via the second channel CH2.

Figure 10:
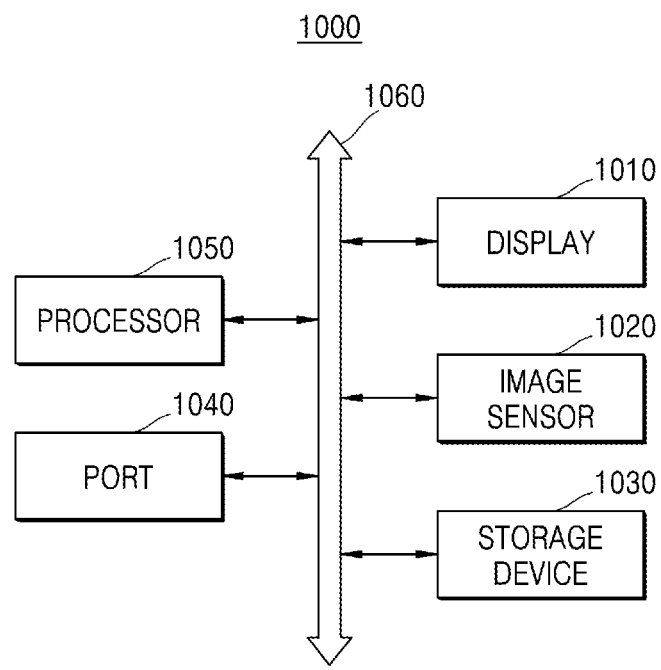
FIG. 10 is a diagram illustrating an electronic device including a storage device according to some embodiments.

FIG. 10 is a diagram illustrating an electronic device including a storage device according to some embodiments.

Referring to FIG. 10, an electronic device 1000 according to some embodiments of the inventive concepts may include a display 1010, an image sensor 1020, a storage device 1030, a port 1040, and a processor 1050. Additionally, although not shown in FIG. 10, the electronic device 1000 according to some embodiments of the inventive concepts may further include additional devices, such as a wired/wireless communication device, a power supply device, or the like.

The port 1040 may be a device provided for the electronic device 1000 to communicate with a video card, a sound card, a memory card, a USB device, or the like. The electronic device 1000 may be implemented as one or more of a smartphone, a tablet personal computer (PC), a smart wearable device, or the like, although in some embodiments the electronic device 100 may be a general desktop computer or a laptop computer, as non-limiting examples.

The processor 1050 may be configured to perform specific operations, instructions, tasks, and the like. The processor 1050 may be a central processing unit (CPU) or a microprocessor unit (MCU), and may communicate with the display 1010, the image sensor 1020, the memory device 1030, as well as other devices connected to the port 1040, via a bus 1060.

The storage device 1030 may be a storage medium that stores data, multimedia data, and the like. In some embodiments, the data stored in the storage device 1030 may be needed for the operation of the electronic device 1000. The storage device 1030 may be or may include a volatile memory, such as a random access memory RAM, and/or a non-volatile memory, such as a flash memory or the like. In some embodiments, the storage device 1030 may include at least one of a solid state drive (SSD), a hard disk drive (HDD), and an optical drive (ODD) as a storage device. The storage device 1030 may include an embodiment of the memory controller and the non-volatile memory device described above with reference to FIGS. 1 to 9.

As the electronic device 1000 may use the storage device 1030 according to the inventive concepts as described herein, it is may be possible to calculate more accurately the time point of performing the word line verification operation. In addition, the read performance of the non-volatile memory device may be improved by calculating more accurately a time point of performing the word line verification operation.

While the inventive concepts have been particularly shown and described with reference to some examples of embodiments thereof, it will be understood that various changes in form and details may be made therein without departing from the scope of the following claims.

What is claimed is:

1. A memory controller configured to control a non-volatile memory device that includes a plurality of memory blocks, each memory block including a plurality of memory cells connected to a plurality of word lines, the memory controller comprising:

a weight management unit configured to store a weight based on a read disturb strength of each of the plurality of word lines of the plurality of memory blocks, the weight stored in a storage of the memory controller;

a counter configured to increase a read count of a management group that includes a target word line, based on the weight of the target word line obtained from the weight management unit, the counter configured to increase the read count in response to the memory controller receiving a read request for the target word line from an external host device;

an initial verification operation determination unit configured to determine whether to perform or to not perform a word line verification operation based on a comparison of a reference trigger count with the read count of the management group that includes the target word line; and a verification operation determination unit configured to determine whether to perform or to not perform a word line verification operation based on a comparison of a reference interval count with the read count of the management group that includes the target word line.

2. The memory controller of claim 1, wherein the weight of each of the plurality of word lines is set to be inversely proportional to a number of reads until an error occurs in the corresponding word line.

3. The memory controller of claim 1, wherein the target word line is classified into a weight group in the weight management unit with at least one other word line from among the plurality of word lines of the plurality of memory blocks having a same weight as the target word line, and
wherein when the weight management unit receives the read request, the weight management unit is configured to transfer, to the counter, a weight corresponding to the weight group.

4. The memory controller of claim 1, wherein the management group includes all of the word lines of a memory block or a super block.

5. The memory controller of claim 1, wherein the reference interval count is set to a value having a preset distribution.

6. The memory controller of claim 1, wherein the verification operation determination unit is configured to determine that the word line verification operation is to be performed if the read count of the management group that includes the target word line is equal to or greater than the reference interval count, and
wherein the verification operation determination unit is configured to determine that the word line verification operation is not to be performed if the read count of the management group that includes the target word line is less than the reference interval count.

7. The memory controller of claim 1, further comprising a verification operation execution unit configured to perform a read operation on a word line to be verified when it is determined by the verification operation determination unit that the word line verification operation is to be performed, and configured to determine whether an error has occurred in the word line to be verified based on a result of performing the read operation on the word line to be verified.

8. The memory controller of claim 7, further comprising a reclaim execution unit configured to perform a reclaim operation on the word line to be verified when it is determined that an error has occurred in the word line to be verified.

9. The memory controller of claim 7, wherein the verification operation execution unit is configured to initialize a read count of the management group that includes the target word line after completion of the word line verification operation.

10. The memory controller of claim 1, wherein the reference trigger count has a value greater than the reference interval count.

11. The memory controller of claim 1, wherein, after it is determined by the initial verification operation determination unit to perform the word line verification operation, the verification operation determination unit is configured to compare the reference interval count with the read count of the management group that includes the target word line.

12. A method of controlling a storage device, the storage device including a non-volatile memory device that includes a plurality of memory blocks, each memory block including a plurality of memory cells connected to a plurality of word lines, the method comprising:
receiving, from a host device, a read request for a target word line;
obtaining a weight of the target word line;
increasing a read count of a management group that includes the target word line, based on a weight of the target word line;
determining whether to perform or to not perform a word line verification operation based on a comparison of a reference trigger count with the read count of the management group that includes the target word line; and
determining whether to perform or to not perform a word line verification operation, based on a comparison of a reference interval count with the read count of the management group that includes the target word line.

13. The method of claim 12, wherein the determining whether to perform or to not perform the word line verification operation comprises:
determining that the word line verification operation is to be performed if the read count of the management group that includes the target word line is equal to or greater than the reference interval count, and
determining that the word line verification operation is not to be performed if the read count of the management group that includes the target word line is less than the reference interval count.

14. The method of claim 12, further comprising:
performing a read operation on a word line to be verified after the word line verification operation is performed; and
determining whether an error has occurred in the word line to be verified, based on a result of performing a read operation on the word line to be verified.

15. The method of claim 14, further comprising, performing a reclaim operation on the word line to be verified when it is determined that an error has occurred in the word line to be verified.

16. The method of claim 14, further comprising, initializing a read count of the management group that includes the target word line after the word line verification operation is completed.

17. A storage device comprising:
a non-volatile memory device including a plurality of non-volatile memory chips; and
a memory controller connected to the plurality of non-volatile memory chips through a plurality of channels, wherein each of the plurality of non-volatile memory chips includes a plurality of memory blocks, each memory block including a plurality of memory cells connected to a plurality of word lines, and
wherein the memory controller comprises:
a weight management unit configured to store a weight based on a read disturb strength of each of the plurality of word lines of the plurality of memory blocks;
a counter configured to increase a read count of a management group that includes a target word line, based on the weight of the target word line obtained from the weight management unit, the counter configured to increase the read count in response to the memory controller receiving a read request for the target word line from an external host device;
an initial verification operation determination unit configured to determine whether to perform or to not perform a word line verification operation based on a comparison of a reference trigger count with the read count of the management group that includes the target word line; and
a verification operation determination unit configured to determine whether to perform or to not perform a word line verification operation based on a comparison of a reference interval count with the read count of the management group that includes the target word line.

18. The storage device of claim 17, wherein the management group is a group including all of the word lines of a memory block, a super block, a non-volatile memory chip, or a plurality of non-volatile memory chips connected through a same channel as the memory controller.

19. The storage device of claim 17, wherein the verification operation determination unit is configured to determine that the word line verification operation is to be performed if the read count of the management group including the target word line is equal to or greater than the reference interval count, and wherein the verification operation determination unit is configured to determine that the word line verification operation is not to be performed if the read count of the management group including the target word line is less than the reference interval count.

\* \* \* \* \*